(12) United States Patent
Franklin et al.

(10) Patent No.: US 12,142,805 B2
(45) Date of Patent: Nov. 12, 2024

(54) NANOWIRE-BASED INTEGRATED VIA IN ANODIC ALUMINUM OXIDE LAYER FOR CMOS APPLICATIONS

(71) Applicant: Regents of the University of Minnesota, Minneapolis, MN (US)

(72) Inventors: Rhonda Franklin, Minneapolis, MN (US); Yali Zhang, Minneapolis, MN (US); Joseph Um, Minneapolis, MN (US); Bethanie Joyce Hills Stadler, Shoreview, MN (US); Rashaunda Henderson, Minneapolis, MN (US)

(73) Assignees: Regents of the University of Minnesota, Minneapolis, MN (US); Board of Regents, The University of Texas System, Austin, TX (US)

( * ) Notice: Subject to any disclaimer, the term of this patent is extended or adjusted under 35 U.S.C. 154(b) by 451 days.

(21) Appl. No.: 17/339,267

(22) Filed: Jun. 4, 2021

(65) Prior Publication Data

US 2022/0393328 A1    Dec. 8, 2022

(51) Int. Cl.
*H01L 23/66* (2006.01)
*H01P 3/00* (2006.01)
*H01P 11/00* (2006.01)

(52) U.S. Cl.
CPC .............. *H01P 3/003* (2013.01); *H01L 23/66* (2013.01); *H01P 11/001* (2013.01); *H01L 2223/6627* (2013.01)

(58) Field of Classification Search
CPC ......... H01L 29/0669–068; H01L 2924/13061; H01L 23/66; H01L 2223/6627
See application file for complete search history.

(56) References Cited

U.S. PATENT DOCUMENTS

| 2004/0112964 | A1* | 6/2004 | Empedocles | ....... H01L 29/0673 |
| | | | | 235/491 |
| 2007/0001220 | A1* | 1/2007 | Tombler, Jr. | ........... B82Y 10/00 |
| | | | | 257/330 |
| 2007/0158642 | A1* | 7/2007 | Gruner | ................. H10K 10/466 |
| | | | | 257/30 |

(Continued)

OTHER PUBLICATIONS

Bleiker et al., "High-Aspect-Ratio Through Silicon Vias for High-Frequency Application Fabricated by Magnetic Assembly of Gold-Coated Nickel Wires," IEEE Trans. Compon. Packag. Manuf. Technology, Jan. 2015, 5(1):21-27.

(Continued)

*Primary Examiner* — Tucker J Wright
(74) *Attorney, Agent, or Firm* — Fish & Richardson P.C.

(57) ABSTRACT

A complementary metal-oxide-semiconductor (CMOS) device includes a metal oxide layer comprising anodic aluminum oxide (AAO) and one or more nanowires (NW) of an electrically conducting material each formed within a corresponding pore extending through the AAO from a first side of the layer to a second side of the layer opposite the first side, a first electrically conducting layer disposed on the first side of the metal oxide layer, and a second electrically conducting layer disposed on the second side of the metal oxide layer. The nanowires form a via electrically connecting first electrically conducting layer and the second electrically conducting layer.

27 Claims, 8 Drawing Sheets

FIG. 1B

(56) References Cited

U.S. PATENT DOCUMENTS

2009/0200536 A1* 8/2009 Van Schaijk ........ H10N 70/011
                                                    257/E21.294
2022/0393329 A1   12/2022 Stadler et al.

OTHER PUBLICATIONS

Margomenos et al., "Fabrication and Accelerated Hermeticity Testing of an On-Wafer Package for RF MEMS," IEEE Trans. Microw. Theory Techniques, Jun. 2004, 52(6):1626-1636.

Pinheiro et al., "Nanowire-based Through Substrate Via for Millimeter-Wave Frequencies," Proceedings of the 2016 IEEE MTT-S International Microwave Symposium (IMS), San Francisco, CA, USA, May 22-27, 2016, 4 pages.

Gagnard et al., "Through silicon via: From the CMOS imager sensor wafer level package to the 3D integration," Microelectron. Eng., Mar. 2010, 87(3):470-476.

Harpel et al., "Vertically Integrated Nanowires on Si Wafers and Into Circuits," IEEE Trans. Magn., Mar. 2023, 59(3):3200505, 5 pages.

Holubowitch et al., "Porous alumina thin films on conductive substrates for templated 1-dimensional nanostructuring," Solid State Ionics, May 2012, 216:110-113.

Lau, "Overview and outlook of through-silicon via (TSV) and 3D integrations," Microelectron. Int., May 2011, 28(2):8-22.

Sukumaran et al., "Design, Fabrication, and Characterization of Ultrathin 3-D Glass Interposers With Through-Package-Vias at Same Pitch as TSVs in Silicon," IEEE Trans. Compon. Packag. Manuf. Technol., May 2014, 4(5):786-795.

Um et al., "Fabrication of long-range ordered aluminum oxide an Fe/Au multilayered nanowires for 3D magnetic memory," IEEE Trans. Magn., Feb. 2020, 56(2):1-6.

Weerasekera et al., "Two-Dimensional and Three-Dimensional Integration of Heterogeneous Electronic Systems Under Cost, Performance, and Technological Constraints," IEEE Trans. Comput.-Aided Design Integr. Circuits Syst., Aug. 2009, 28(8):1237-1250.

Zhang et al., "Study of Nanowire-Based Integrated via Technology for CMOS Application in Millimeter-Wave Frequencies," IEEE Microwave and Wireless Components Letters, Jun. 2021, 31(6):693-696.

* cited by examiner

NANOWIRE-BASED INTEGRATED VIA IN ANODIC ALUMINUM OXIDE LAYER FOR CMOS APPLICATIONS

TECHNICAL FIELD

This disclosure relates to nanowire (NW) based vias for CMOS and other semiconductor-based applications. This disclosure also relates to methods for forming the vias in anodic aluminum oxide (AAO).

BACKGROUND

Anodic aluminum oxide (AAO) is a nanoporous material that can be used as a template material for various functional nanomaterials and nanodevices, including nanowires (NWs). Many potential applications for AAO will involve reliably forming an AAO layer on a rigid substrate, such as a Si wafer. To incorporate such materials into many applications at a commercial scale, reliable adhesion between the AAO layer and the rigid substrate is necessary.

Future millimeter and sub-millimeter wave communication systems are likely to be the key enablers to internet of things technology, autonomous vehicles, and low-power cube-satellites, among other technologies. In these areas, devices using 3D integrated circuits (ICs) can be a game changer. By using a 3D IC structure, low cost and volume can be provided due to the compactness of the structures. Also, high signal speed and low power consumption can be achieved.

In ICs and systems, vias play an important role providing high-density interconnections between active devices as well as being used in grounding, signal routing, and transitions between microstrips and coplanar waveguides (CPWs). Compared to conventional wire bonding technology, vias can provide interconnection paths with less metal and therefore lower parasitic resistance and inductance.

However, as the communication frequency band expands progressively into millimeter and even sub-millimeter wave frequencies, higher skin depth loss and parasitic inductance for vias becomes increasingly problematic. To reduce these issues, different substrate materials, such as high resistivity silicon (Si) wafers, glass, and commercial anodized alumina oxide (AAO), may be used to reduce the high frequency loss. Currently via thickness range is typically 50-250 μm for these technologies.

SUMMARY

Techniques for fabricating and characterizing ultra-thin vias that are desirable for 3D IC CMOS applications are disclosed. Specifically, embodiments are disclosed that include via structures in which AAO with copper (Cu) nanowires (NWs) is integrated onto Si wafers. CPW lines on Si are used to evaluate the via loss and to minimize Si substrate loss from the via assessment. The structure provides low power loss due to the benefit of the substrate material and NW properties.

To fabricate AAO on Si, a metal layer (such as Au, Pt, or Cu) is typically deposited as an electrical contact and a base conducting substrate for nanomaterials or devices. An adhesion layer (e.g., Ti) can be used to enhance adhesion between the Si and metal layer if necessary. After the metal layer deposition, a Ti adhesion layer is usually deposited to increase adhesion between the metal and Al layers in order to avoid AAO delamination which occurs due to volume expansion during the conversion of Al to AAO or due to damage to the metal layer from over-anodization. After adhesion layer deposition, an Al layer is deposited and anodized to make AAO. This technique results in the AAO having an insulating oxide barrier at the bottom of the pores that should be penetrated to reach the underlying metal layer. The inventors have discovered that use of an alloy (e.g., TiW) as the adhesion layer between the metal layer and the Al layer can enhance the stability of the multilayer structure during this fabrication process, enabling reliable production of devices using such structures.

More generally, the disclosed techniques can be integrated into other semiconductor processes (e.g., involving SiGe, III-V materials, etc.) for different transistor technologies, including bipolar and other transistor technologies.

In general, in a first aspect, the disclosure features a complementary metal-oxide-semiconductor (CMOS) device, including: a metal oxide layer comprising anodic aluminum oxide (AAO) and one or more nanowires (NW) of an electrically conducting material each formed within a corresponding pore extending through the AAO from a first side of the layer to a second side of the layer opposite the first side; a first electrically conducting layer disposed on the first side of the metal oxide layer; and a second electrically conducting layer disposed on the second side of the metal oxide layer, wherein the one or more nanowires form a via electrically connecting first electrically conducting layer and the second electrically conducting layer.

Implementations of the CMOS device can include one or more of the following features and/or features of other aspects. For example, the metal oxide layer can have a thickness of 5 μm or less (e.g., from 1 μm to 2 μm).

The electrically conducting material of the NWs can be Cu.

The CMOS device can include a Si layer, the metal oxide layer and first and second electrically conducting layers being disposed on the Si layer.

The via can include a bundle of NWs.

The AAO can have a porosity in a range from 8% to 30%. The first electrically conducting layer can be a Cu layer. The CMOS device can include an adhesion layer between the Cu layer and the metal oxide layer. The adhesion layer can include TiW alloy and TiW oxide. The CMOS device can include a layer of Ti between the Cu layer and the Si layer.

At least the first or second electrically conducting layer can include a coplanar waveguide (CPW).

In another aspect, the disclosure features an integrated circuit including the CMOS device. The integrated circuit can be part of a communication system for operation at millimeter or sub-millimeter wavelengths.

In general, in a further aspect, the disclosure features a method for forming a semiconductor device, including: forming a first electrically conducting layer on a substrate; forming an adhesion layer comprising an alloy on the first electrically conducting layer; forming a layer of aluminum on the adhesion layer; anodizing the aluminum to form a metal oxide layer comprising anodic aluminum oxide (AAO), the metal oxide layer comprising a plurality of nanopores extending through the AAO from a first side of the metal oxide layer to the first electrically conducting layer; depositing an electrically conducting material in the nanopores to form nanowires (NW) in the nanopores; and after depositing the electrically conducting material in the nanopores, forming a second electrically conducting layer on the metal oxide layer. The one or more nanowires form a via electrically connecting the first electrically conducting layer and the second electrically conducting layer.

Implementations of the method can include one or more of the following features and/or features of other aspects. For example, the semiconductor device can be a complementary metal-oxide-semiconductor (CMOS) device. The via can include a bundle of NWs. The metal oxide layer can have a thickness of 5 μm or less. The electrically conducting material can be Cu and the adhesion layer can include TiW.

In general, in a further aspect, the disclosure features a method for forming anodic aluminum oxide (AAO) on a substrate, the method including: disposing an Al layer on the substrate, there being a Cu layer between the substrate and the Al layer, and a TiW alloy layer between and in contact with the Cu layer and the Al layer; anodizing the Al layer to provide an AAO layer comprising nanopores extending into the AAO layer to a barrier layer of the AAO at a base of each nanopore and converting at least some of the TiW alloy layer to TiW oxide; over-anodizing the barrier layer to remove at least a portion of the AAO of the barrier layer at the base of each nanopore; and exposing the AAO layer, the TiW oxide, and the TiW to a chemical etchant sufficient to extend the nanopores through the AAO layer to a surface of the Cu layer.

Implementations of the method can include one or more of the following features and/or features of other aspects. For example, the TiW alloy can be $Ti_xW_{1-x}$, where $0.05 < x < 0.2$ (e.g., x=0.1).

The Al layer can have a thickness in a range from 0.5 μm to 10 μm and the TiW alloy layer has a thickness less than 100 nm.

A Ti layer can be located between the substrate and the Cu layer.

The chemical etchant can include an etchant in aqueous solution. The etchant can be $H_3PO_4$.

The AAO layer can be exposed to the chemical etchant under conditions sufficient to widen the nanopores.

The method can include depositing an electrically conducting material in the nanopores to form nanowires (NWs) in the AAO layer. The method can include forming a layer of an electrically conducting material on a surface of the AAO layer opposite the substrate after depositing the electrically conducting material in the nanopores.

In general, in yet another aspect, the disclosure features an article, including: a substrate; an anodic aluminum oxide (AAO) layer disposed on the substrate, the AAO layer including multiple nanopores; a metal layer disposed on the substrate between the AAO layer and the substrate; and a TiW alloy layer having a thickness of 100 nm or less disposed on the substrate between the metal layer and the AAO layer, the TiW alloy layer being in contact with the metal layer.

Embodiments of the article can include one or more of the following features and/or features of other aspects. For example, the AAO layer can include a barrier layer at a base of the plurality of nanopores between the nanopores and the TiW alloy layer.

The article can include TiW oxide between the TiW alloy layer and the AAO layer.

The metal layer can be a Cu layer.

The article can include a Ti layer between the metal layer and the substrate.

In general, in still another aspect, the disclosure features an article, including:
a substrate; an anodic aluminum oxide (AAO) layer disposed on the substrate; a metal layer disposed on the Si substrate between the AAO layer and the substrate; a TiW alloy layer disposed on the substrate between the metal layer and the AAO layer, the TiW alloy layer being in contact with the metal layer; and TiW oxide between the TiW alloy layer and the AAO layer, wherein the nanopores extend through the AAO layer, the TiW oxide, and the TiW alloy layer to the Cu layer.

Embodiments of the article can include one or more of the following features and/or features of other aspects. For example, the nanopores can be filled with a metal, e.g., Cu.

The article can include a Ti layer between the Cu layer and the substrate.

The substrate can be a Si substrate.

Embodiments can provide a variety of advantages. For example, the techniques disclosed herein can be used to reliably fabricate thin via NW structures on a silicon substrate. The techniques can mitigate delamination and other issues that reduce the viability of these structures at a commercial scale. The techniques can be used to form NWs that are easily penetrated by high frequency fields due to their nanometer size and therefore show less skin depth effect. Accordingly, using bundles of NWs, total power loss associated with via interconnections can be decreased. Also, by using integrated AAO, ultrathin via thickness can be provided and improved integration can be achieved.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
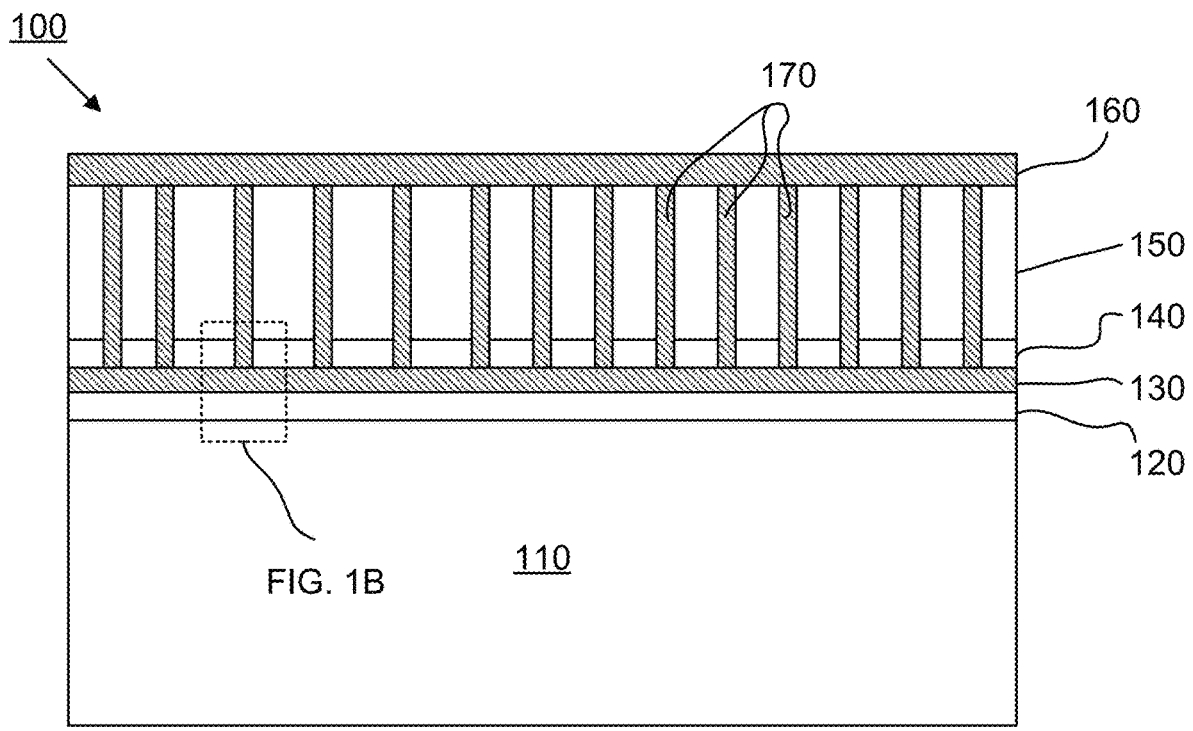
FIG. 1A is a cross-sectional schematic diagram showing a portion of an example device with NW vias formed in a AAO layer between two electrically conducting layers on a silicon substrate.

Referring to FIG. 1A, an integrated circuit (IC) device 100 includes a nanopore layer 150 that includes multiple nanowires (NWs) 170 penetrating through the nanopore layer 150 providing a via electrically connecting an upper conducting layer 160 and a lower electrically conducting layer 130. The nanopore layer 150 is composed of AAO. The electrically conducting layers 130 and 160 are typically metal layers (e.g., Au, Pt, or Cu). NWs 170 are formed by depositing an electrically conducting material, such as a suitable metal (e.g., Cu or Ni), in the nanopores in the nanopore layer 150. The material forming the NWs can be the same electrically conducting material as that used for one or both of the electrically conducting layers 130 and 160. In some embodiments, copper can be used for the NWs 170 and/or one or both of the electrically conducting layers 130 and 160.

The nanopore layer 150 and conducting layers 130 and 160 are supported by a substrate 110, such as a Si wafer (e.g., a high resistivity Si wafer). An adhesion layer 120 is deposited between the lower electrically conducting layer 130 and substrate 110. The intervening layer 120 can be formed from a material that promotes adhesion between the substrate material and the material forming the lower electrically conducting layer 130. For example, intervening layer 120 can be a titanium layer which can promote adhesion between a Si wafer and an electrically conducting layer.

Figure 1B:
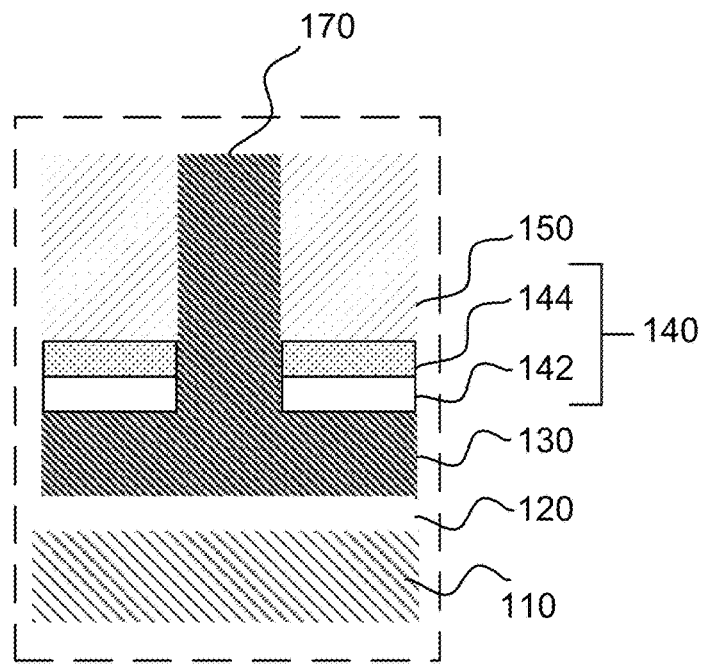
FIG. 1B is a cross-sectional schematic diagram showing a close up of an adhesion layer of the example device shown in FIG. 1A.

A second adhesion layer 140 is deposited between the lower electrically conducting layer 130 and the nanopore layer 150. Referring also to FIG. 1B, which shows a close up section of device 100, adhesion layer 140 is composed in part of an alloy (e.g., TiW) and in part of an oxide of the alloy (e.g., TiW oxide). These portions are depicted in FIG. 1B as layers 142 and 144 in which layer 144 is the oxide portion of adhesion layer 140 and is generally adjacent the AAO of the nanopore layer 150, while layer 142 is the alloy portion and is generally adjacent electrically conducting layer 130. While depicted as discrete planar layers, these portions may have uneven thicknesses. For example, in some areas, the alloy oxide portion can penetrate nearly the entire depth of adhesion layer 140 from the nanopore layer 150 to close to the top surface of the lower electrically conduction layer 130. In other areas, the entire adhesion layer may be pure alloy through its depth with no oxidation.

The porosity of the nanopore layer 150 can be in a range from about 8% to about 30%. Typically, the porosity varies by about 1% within a single sample. The size of the nanopores can also vary as desired. In some embodiments, the nanopores have a lateral dimension (i.e., in the plane of the nanopore layer) in a range from 5 nm up to 250 nm. Nanopore lateral dimensions may vary about 10% in any one sample. For example, individual samples can include nanopores with a lateral dimension that varies from 9-11 nm or 45-55 nm.

In some embodiments, nanopore layer 150 includes areas in which the nanopores do not include NWs. For example, patterned deposition can be used to selectively formed NWs in certain regions of nanopore layer 150. Generally, the area of nanopore layer 150 that includes NWs corresponds to the size of the via and this size can vary depending on the application. In some embodiments, vias can have a lateral dimension of 100 µm or less (e.g., 50 µm or less, 20 µm or less, 10 µm or less, 5 µm or less).

The NWs 170 may penetrate through adhesion layer 140 so that the electrically conducting material forming the NWs is in physical contact with the lower electrically conducting layer 130. Alternatively, or additionally, adhesion layer 140 can provide an electrical connection between NWs 170 and the lower electrically conducting layer 130.

In general, the composition of the alloy can be established empirically. As noted above, the alloy in adhesion layer 140 can be TiW. Generally, the relative concentration of Ti to W can vary as appropriate and the relative concentrations can be optimized empirically. In some embodiments, the alloy is at least 50% W by weight (e.g., 60% or more, 70% or more, 80% or more, 90% or more, such as up to 98%.) In some embodiments, the TiW alloy is $Ti_xW_{1-x}$, where $0.05<x<0.2$. For example, the alloy can be $Ti_{0.1}W_{0.9}$ (Ti 10/W 90 wt. %).

In some embodiments, other metals can be included either as an alternative to Ti or W, or in addition to Ti and W.

In general, the thickness of the different layers disposed on the substrate 110 can vary as appropriate and can, in certain embodiments, be relatively thin. For example, the nanopore layer 150 can be about 2 µm or less (e.g., 1.5 µm or less, 1.2 µm or less, 1.0 µm or less, 0.9 µm or less, 0.8 µm or less, such as as thin as 0.5 µm). The thickness of electrically conducting layers 130 and 160 can be the same, or the two layers can have different thickness. In some embodiments, these layers have a thickness in a range from 0.5 µm to about 5 µm (e.g., from 1 µm to 3 µm, such as 1 µm to 2 µm). Generally, intervening layer 120 and adhesion layer 140 are thinner than lower electrically conducting layer 130. In certain embodiments, intervening layer 120 has a thickness less than 100 nm (e.g., 20 nm to 80 nm, such as 40 nm to 50 nm). Adhesion layer 140 can have a thickness less than 200 nm (e.g., 20 nm to 150 nm, such as 50 nm to 100 nm).

In general, the IC device 100 can be incorporated into a variety of more elaborate IC structures, including complementary metal-oxide-semiconductor (CMOS) devices. CMOS technology is used for constructing integrated circuit (IC) chips, including microprocessors, microcontrollers, memory chips (including CMOS BIOS), and other digital logic circuits. CMOS technology is also used for analog circuits such as image sensors (CMOS sensors), data converters, RF circuits (RF CMOS), and highly integrated transceivers for many types of communication. Accordingly, IC device 100 can be incorporated into any of the aforementioned CMOS devices. In some embodiments, IC device 100 is incorporated into a millimeter or sub-millimeter wave communication system using CMOS technology.

Forming IC device 100 generally involves anodizing a layer of aluminum to form the nanoporous AAO layer 150 over a copper layer and then depositing a metal (or other electrically conducting material) over the AAO layer to provide NWs 170 within the pores of the AAO layer. Referring to FIGS. 2A-2H, which schematically shows cross-sectional portions of the device at different stages of the fabrication process, an example process proceeds as follows.

Figure 2A:
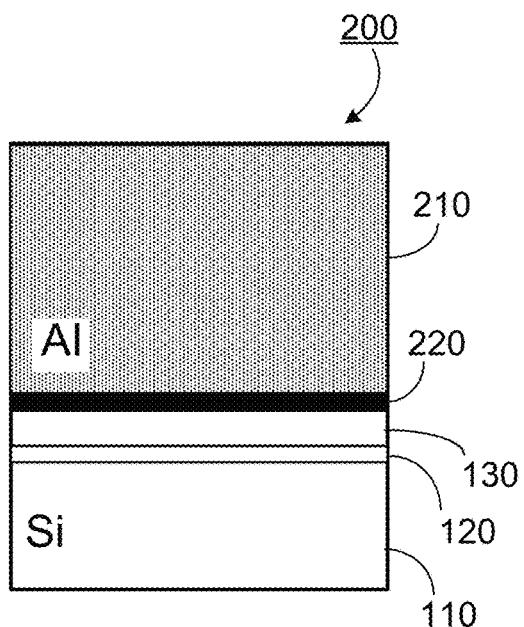
FIG. 2A-2H are cross-sectional schematic diagrams showing a sequence of steps in an example method of forming the device shown in FIG. 1A.

First, a multilayer film stack 200 is formed on a Si wafer substrate 110. This stack is shown in FIG. 2A and is composed of, in order, layer 120 of Ti on the Si substrate 110's surface, metal layer 130 (e.g., Cu) on the Ti layer 120, an adhesion layer 220 composed of a TiW alloy on the surface of metal layer 130, and an Al layer 210 on the adhesion layer 220.

Figure 2B:
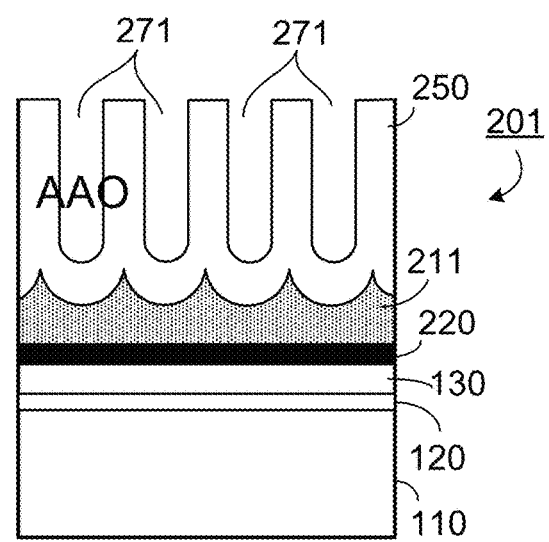

FIGS. 2B-2G show different stages in the Al anodization process. Referring to FIG. 2B specifically, anodization of the Al layer 210 chemically transforms aluminum in the Al layer 210 into AAO 250 perforated by pores 271. The nanoporous oxide 271 extends progressively deeper into the remaining Al 211, but the pores are separated from the aluminum by a barrier layer of aluminum oxide at the base of each pore 271.

Figure 2C:
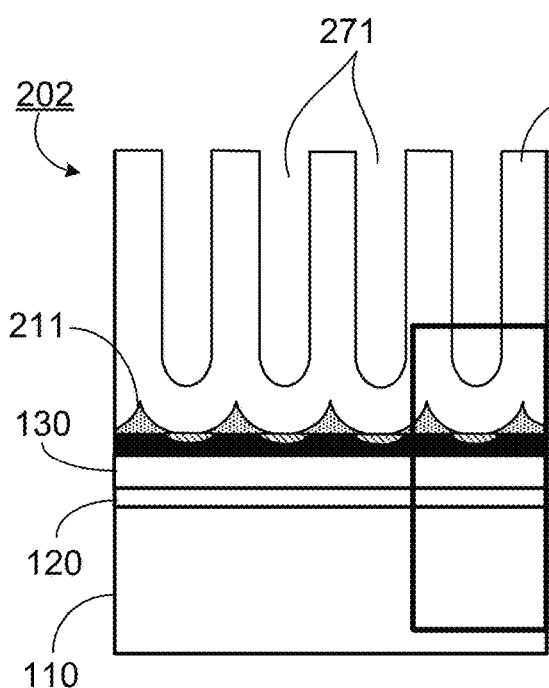
Figure 2D:
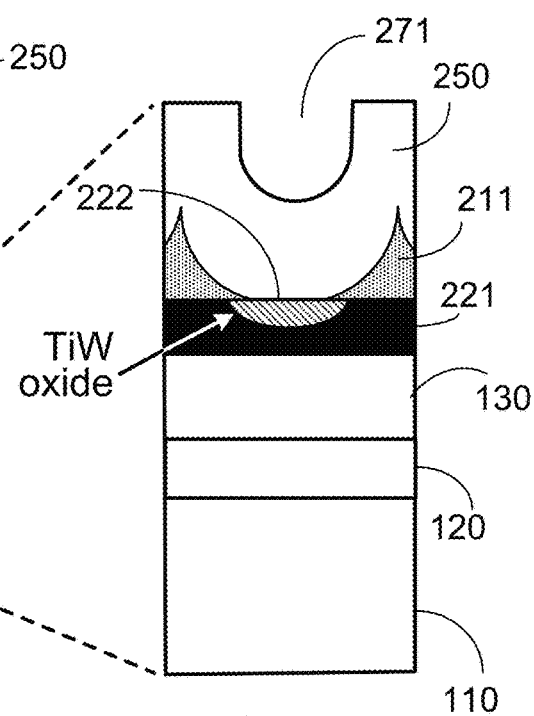

Referring to FIGS. 2C and 2D, oxidation of the aluminum proceeds through the depth of the Al layer 250 to the TiW adhesion layer below where it begins to oxidize portions of the adhesion layer, resulting in portions 222 of TiW oxide in a continuous layer 221 of TiW. Without wishing to be bound by theory, it is believed that when the anodization process reaches the TiW layer 220, $O^{2-}$ and $OH^-$ anions in the anodizing solution are drawn through the barrier layer at the base of the pore 271 by the strong electric field and TiW then starts to be anodized to TiW oxide 222.

Figure 2E:
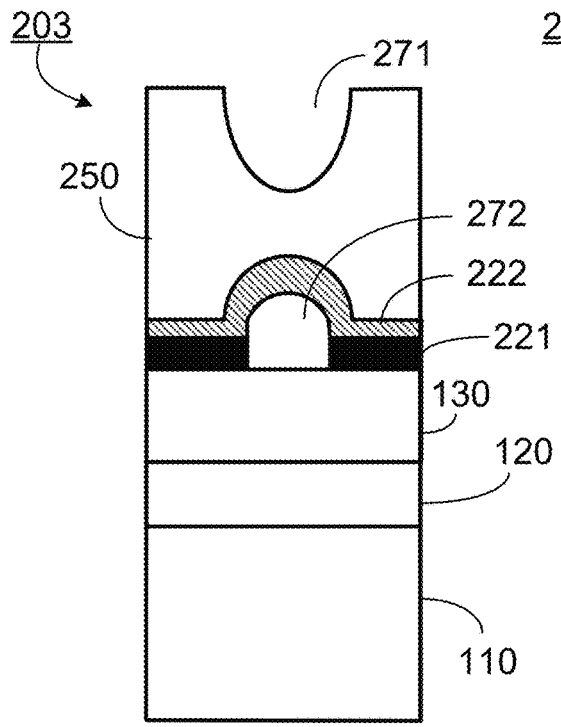

Referring to FIG. 2E, further anodization results an inverted pore base 272 forming in the adhesion layer beneath pore 271 due to further oxidation of the TiW of the adhesion layer and the deepening on the pore 271. It is believed that TiW directly under the pore is anodized to TiW oxide, while TiW under the pore walls remains, and the barrier layer shape is changed due to the volume expansion stress of further anodization. The result is inverted pore base 272

Figure 2F:
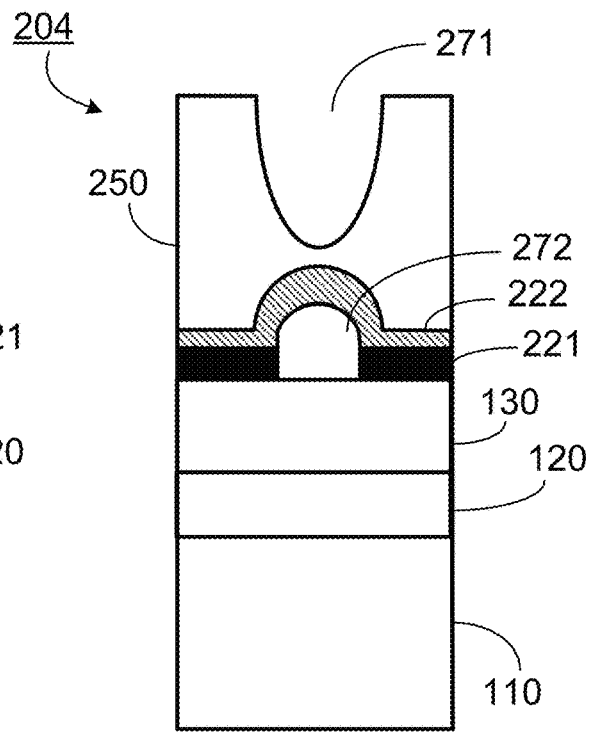
Figure 2G:
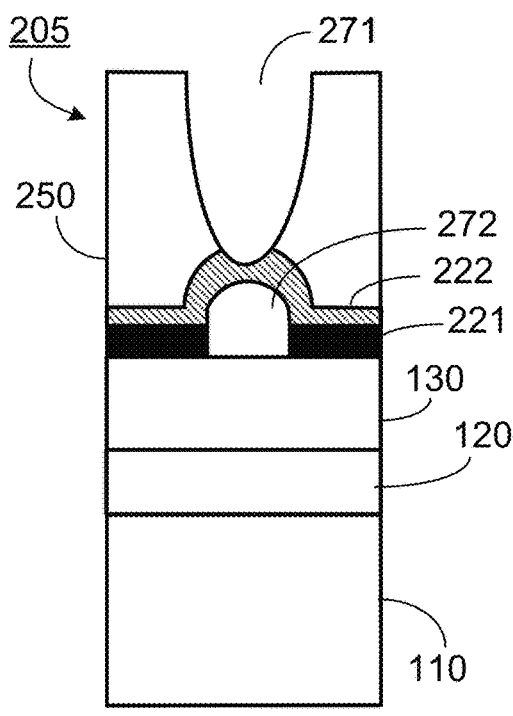
Figure 2H:
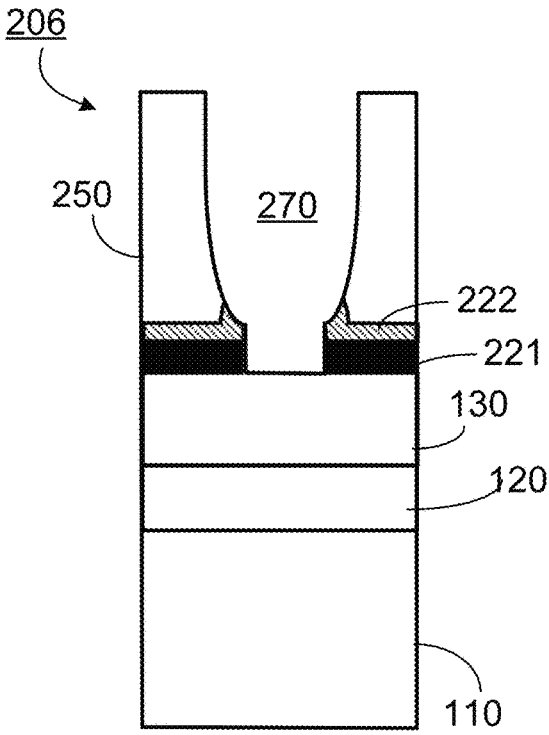

Referring to FIG. 2F, ongoing anodization further reduces the thickness of the barrier layer separating pore 271 from inverted pore base 272. Over anodization begins to etch the TiW oxide separating the pore 271 from the inverted pore base 272 (FIG. 2G), ultimately forming a channel through the AAO layer 250, the TiW oxide 222, and the TiW 221 (FIG. 2H), resulting in a nanopore that extends from the top surface of the AAO layer 250 through to the Cu layer 130. Over-anodization for 1-2 minutes can enable the anodizing solution to etch the barrier layer and TiW oxide in an attempt to reach the bottom metal layer 130. At this stage, the anodization current may increase because most pores start to open together by over-anodization and the electrically conductive area (i.e., of metal layer 130) increases rapidly. Further over-anodization can increase the current very rapidly and decreases after some time, resulting in damage to the metal layer 130 and/or dissolution of metal from the metal layer 130. Accordingly, the anodization can be stopped at the soon after an increase in current is observed in order to reduce damage to the metal layer 130 due to over-anodization.

Further process steps are possible. For example, the diameter of the pores can be widened by further chemical etching. In some embodiments, in order to complete pore perforation and widen the pores as needed, conventional chemical etching (e.g., using 5 wt % $H_3PO_4$) can be used since TiW oxide can be etched in aqueous solutions.

After forming the pores, the NW material (e.g., Cu) is deposited into the pores to form the NWs. While Cu is mentioned as an example, more generally any suitable electrically conducting material can be used, including other metals such as nickel. Any method appropriate for depositing the material into the pores under conditions in which the AAO layer is maintained can be used. For example, electrodeposition can be used to deposit, e.g., metals into the pores.

After formation of the NWs, the top surface can be polished (e.g., using chemical mechanical polishing) to provide a flat surface for further processing steps (e.g., deposition of another electrically conducting layer or other materials).

Figure 3:
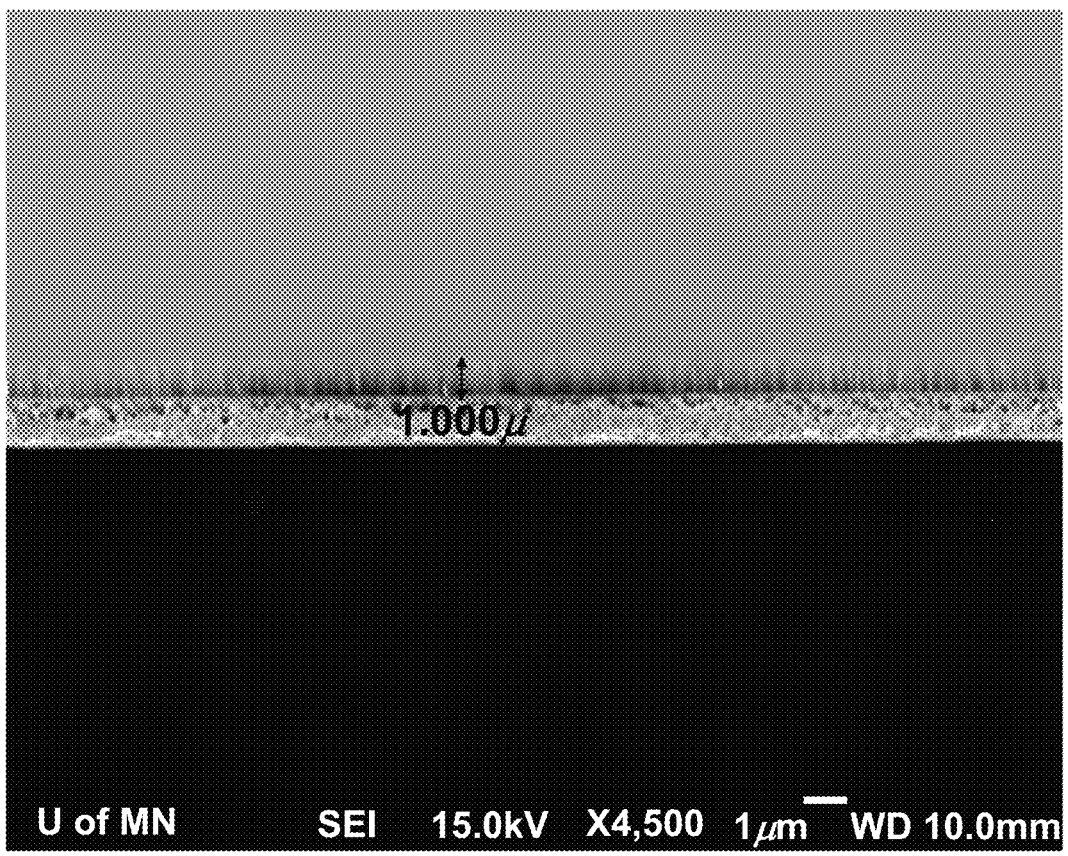
FIG. 3 is a Scanning Electron Micrograph (SEM) of an example article with nanowires formed in an AAO layer on a silicon substrate.

An example of an AAO nanoporous layer with NWs formed using this method is shown in cross-section in FIG. 3. In this example, a 1-μm thick layer of AAO is integrated on a Si substrate using a TiW adhesion layer with electrodeposited Cu NWs. The AAO layer is the top layer and the NWs are visible as white rods through AAO due to 15 kV acceleration voltage.

In general, it is believed that the TiW adhesion layer allows robust and reliable integration of AAO on substrates, to remove barrier layer for electrical contact, and to widen pores of the AAO for various nanomaterials and devices without issues caused by using Ti and reverse bias-based etching (e.g., unremovable barrier layer or AAO delamination).

Conventional techniques to remove a barrier layer that results from AAO formation: (i) decreasing the anodization voltage; and (ii) electrochemical etching via reversed bias. However, decreasing the anodization voltage can result in the dendritic pore channels near the barrier layer, which are not uniformly straight vertical pores. Also, electrochemical etching via reversed bias (e.g., for inducing localized alumina dissolution to reveal the metal base) can catalyze the electrolysis of water and makes $H_2$ gas causing delamination of AAO from the substrate even with a Ti adhesion layer.

When a Ti adhesion layer is used between metal layer and Al, for example, Ti can be oxidized to $TiO_2$ under Al anodization conditions. But, $TiO_2$ is another insulating oxide and can be hard to remove since it is chemically stable. Also, when a thin Ti layer (e.g., <5 nm) is used as an adhesion promoter, the whole Ti layer can easily be converted to $TiO_2$ and its adhesion can be lost. Conversely, thick Ti (e.g., >20 nm) can form a thick $TiO_2$ barrier layer which is difficult to remove. An intermediate thickness Ti layer (e.g., 5-20 nm) can be used, but electrochemical etching via reversed bias may be needed to remove the barrier layer, causing AAO delamination.

Viability of vias formed using the techniques disclosed herein for CMOS application at millimeter-wave frequencies has been demonstrated as described below. Coplanar waveguide (CPW) lines were fabricated on a 5000 Ω·cm high resistivity silicon wafer and connected by Cu nanowire vias that were grown in integrated anodized alumina oxide (AAO). The AAO layer was fabricated by anodizing an evaporated aluminum layer on the silicon wafer as described above. This co-integrated technology was demonstrated as having 0.095 dB insertion loss for 0.3 mm long circuits with two vias at 40 GHz. Estimated loss per via was ~0.0275 dB. The fabricated structure showed excellent performance agreement with reference test circuits of similar length. The design comparisons of circuits with different via dimensions and positions showed that the shorter via length, wider via width and placing the via on the CPW ground plane closer to the signal line provided improved performance.

Figure 4A:
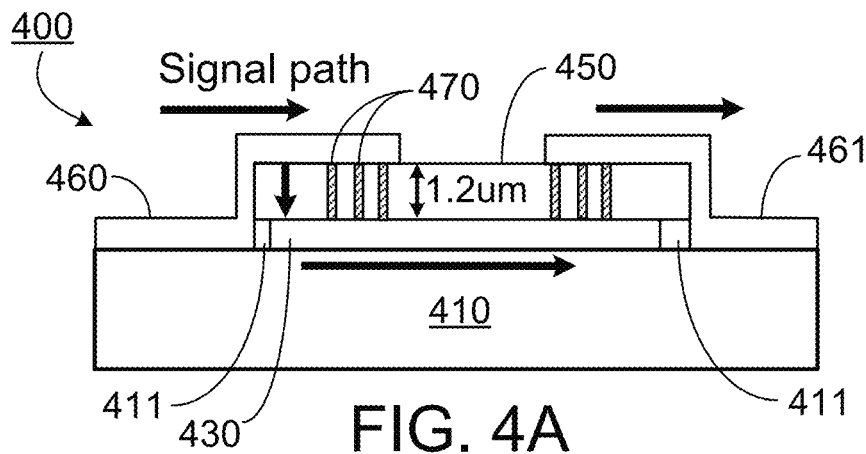
FIG. 4A is a cross-sectional diagram showing a one-unit CPW circuit that includes NW vias in an AAO layer.
Figure 4B:
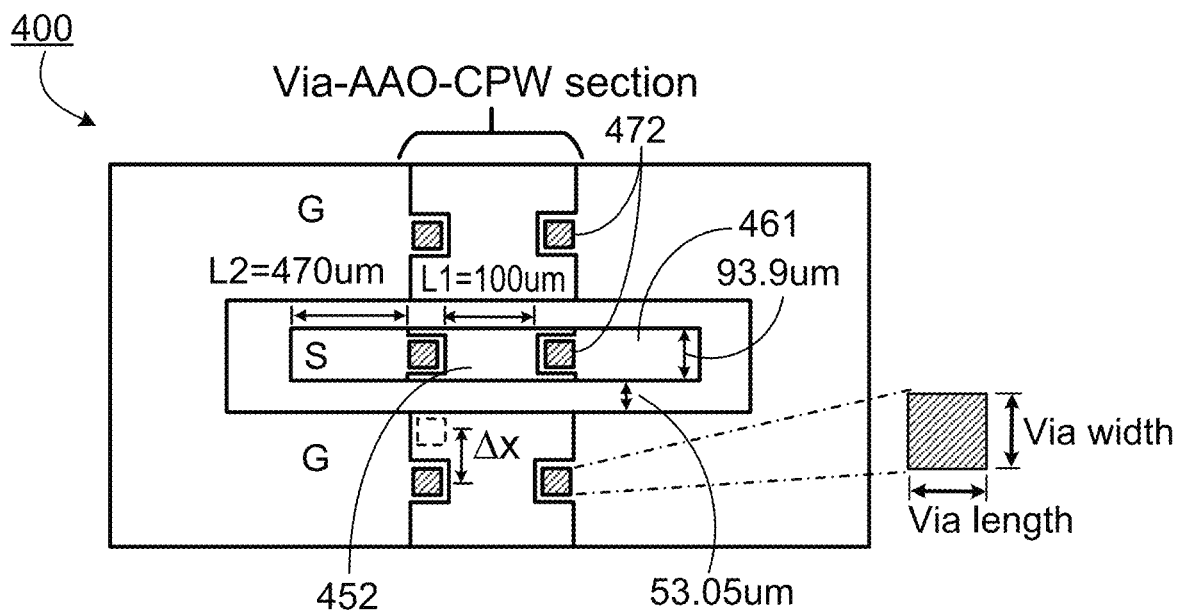
FIG. 4B is a plan view of the one-unit CPW circuit shown in FIG. 4A.

Referring to FIGS. 4A-4B, the NW vias are tested through CPW lines, shown in sectional view in FIG. 4A and plan view in FIG. 4B. Here, a one-unit cell circuit includes a Via-AAO-CPW section and two CPW feed lines 460 and 461. The Via-AAO-CPW section is defined by two rectangular vias 472 (each composed of numerous NWs 470) plus a CPW 430 below an AAO section 452 having a length L1. The entire structure was formed on a Si substrate 410 and feed lines 460 and 461 were electrically isolated from CPW 430 by air regions 411. The one-unit CPW circuit was surrounded by a grounded electrode, G.

Two types of vias were constructed. Type 1 had via length (VL) of 90 μm and via a width (VW) on signal line (S) and ground (G) of 80 μm and 390 μm, respectively. Type 2 had equal VW on S and G, VL is varied from 30 μm to 150 μm and VW was varied from 30 μm to 70 μm. The optimized via location on G was studied by comparing an offset value, Δx, of zero and 130 μm.

Figure 4C:
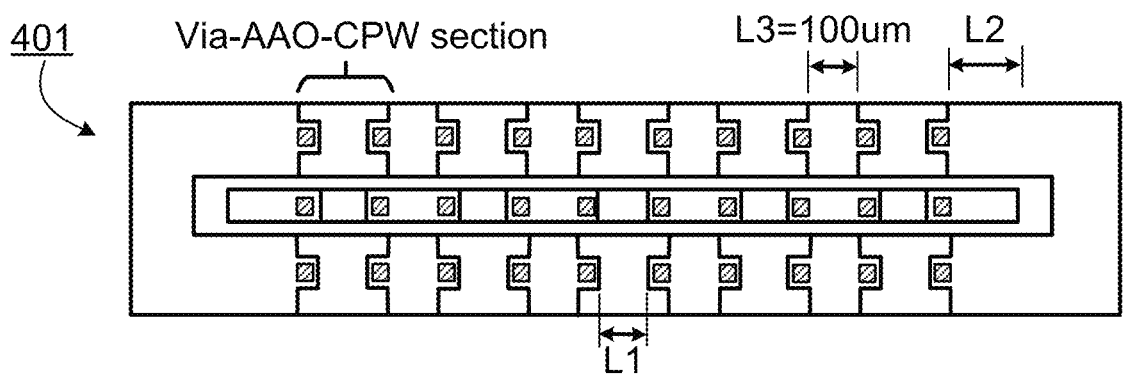
FIG. 4C is a plan view of another example, five-unit CPW circuit that includes NW vias in an AAO layer.

Referring specifically to FIG. 4C, to further enhance the signal level of vias, a five-unit CPW circuit 401 with vias was designed to include five Via-AAO-CPW sections for a total of 10 NW vias.

Here, a CPW line was fabricated on a 500 μm thick 5000 Ω·cm resistivity Si wafer. The 1.2 μm AAO template was anodized from an evaporated aluminum (Al) layer that was pore widened to an average of 20 nm pore diameter and 9% porosity. Next, the Cu NWs were grown into the AAO template using electrodeposition. The vias were created by connecting the NWs in pores to the top Cu layer.

The fabricated structures were characterized using an Anritsu 37369D VNA up to 40 GHz connected to a Cascade probe station RF-1. A 500 µm thick 5000 Ω·cm high resistivity Si wafer was included between measured sample and the metallic chuck for isolation. LRM calibration was performed with Cascade ACP50 probes (pitch of 150 µm) and an ISS 101-190 calibration chip. The reference plane was the probe tip.

Figure 5A:
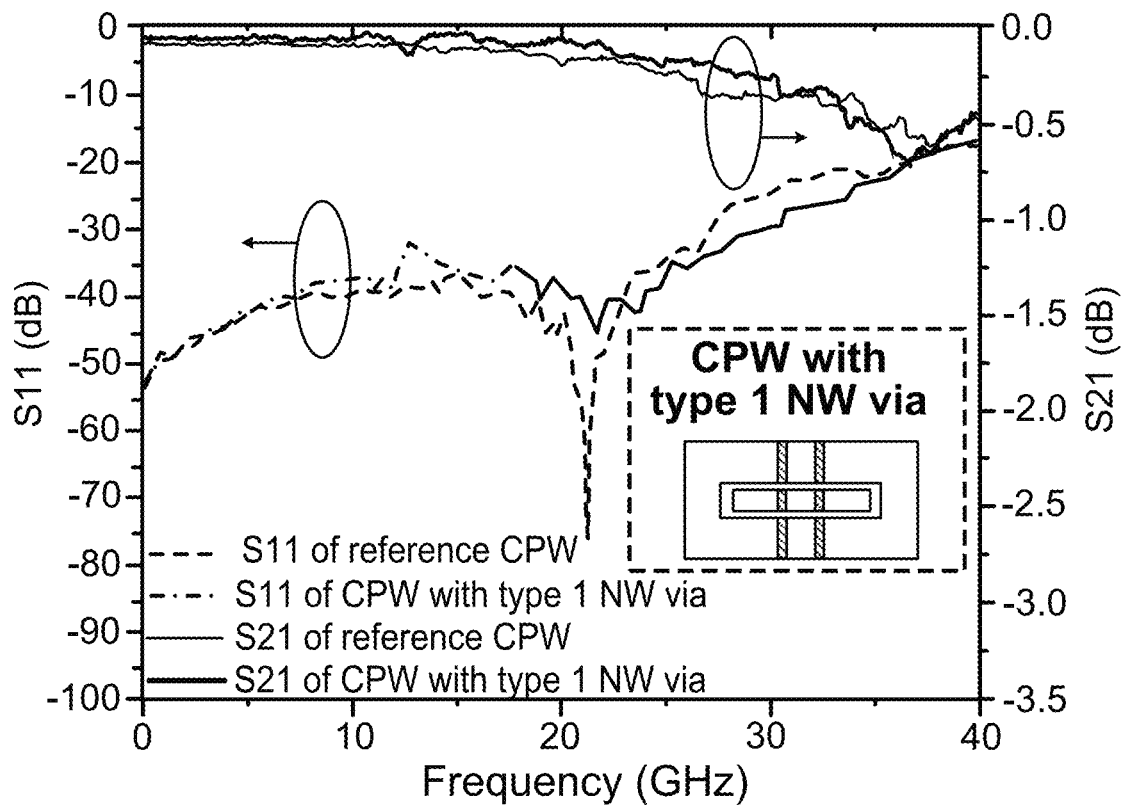
FIGS. 5A-5E are plots showing insertion loss performance of example CPW circuits with NW vias across a frequency range from 0 GHz to 40 GHz.
Figure 5B:
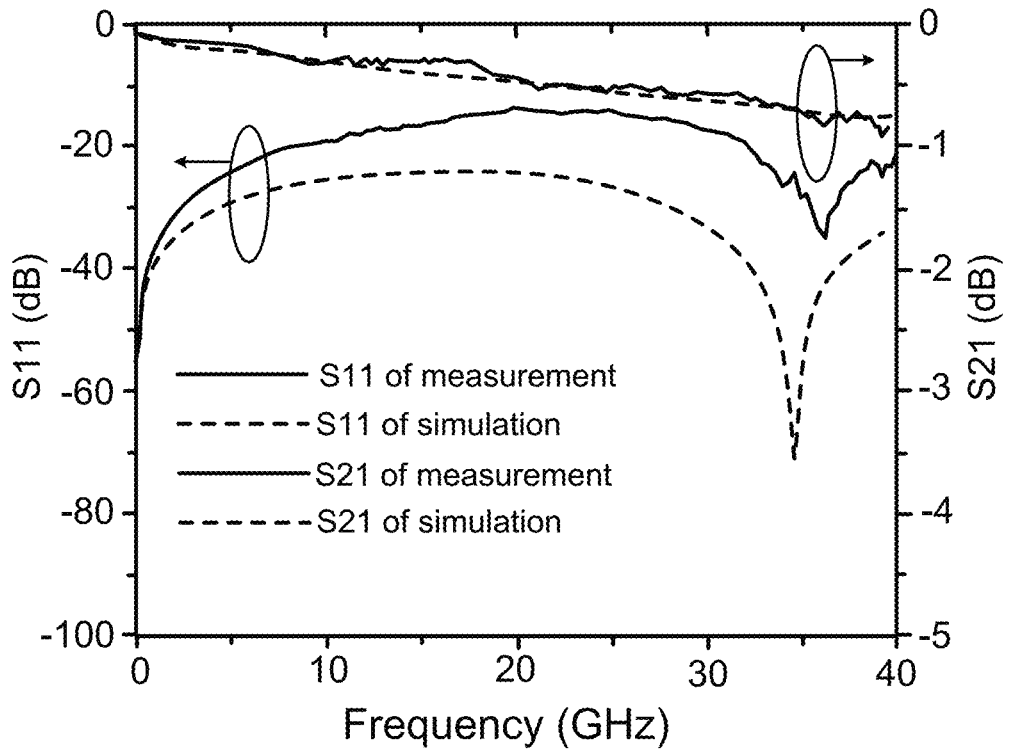

In FIG. 5A, a comparison of insertion loss for a one-unit CPW with type 1 NW via and its 1,224 µm reference circuits are shown as a function of signal frequency from 0 to 40 GHz. The data of CPW with type 1 via agrees well with the reference circuits and demonstrates around 0.05 dB lower insertion loss between 25-30 GHz. This is believed to confirm the benefit of using Cu NW-based vias which provide similar performance to standard CPW lines. Here, S11 and S21 refer to scattering parameters commonly used to describe the performance of microwave circuits. They may be determined as the voltage ratio between output port and input port. For example, S21 can be determined as the output voltage at port 2 divided by input voltage at port 1. Put another way, S11 is a reflection coefficient and describes how much of the input signal is reflected signal. S21 is an insertion loss and describes how much of the input signal is transmitted to the output port In FIG. 5B, a comparison of HFSS (High Frequency Structure Simulation, software commercially available from Ansys, Inc., Canonsburg PA) simulation and measurement results are shown. For the simulation, due to the high aspect ratio between the Cu NW diameters and CPW dimensions (e.g., nm diameters vs um widths and lengths and height), the NW vias were represented by Cu pillars with 1.2 µm thickness, 5×5 µm² area and 9% porosity. The comparison shows that the measurement follows the simulation trend in S21 data presented in FIG. 5A. It is believed that the differences between the measured S11 and the simulation may be due to the fabrication defects, such as over etching.

Figure 5C:
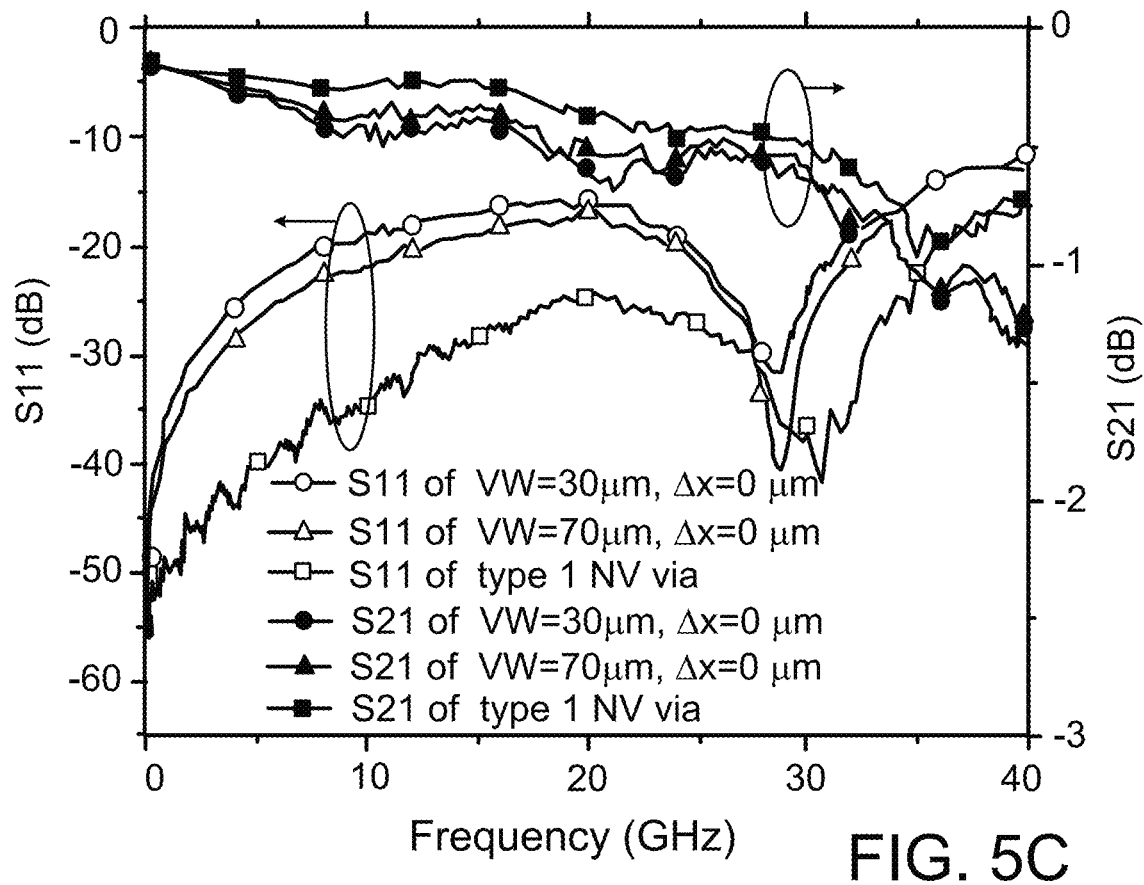

FIG. 5C shows a plot of measurement data comparing insertion loss for different via widths. With the same VL of 90 µm, larger VW shows better insertion loss and reflection coefficient. CPW with type 1 NW via shows the best performance among the different vias, presumably due to its widest VW on both S and G plane which provides more area for current to flow through.

Figure 5D:
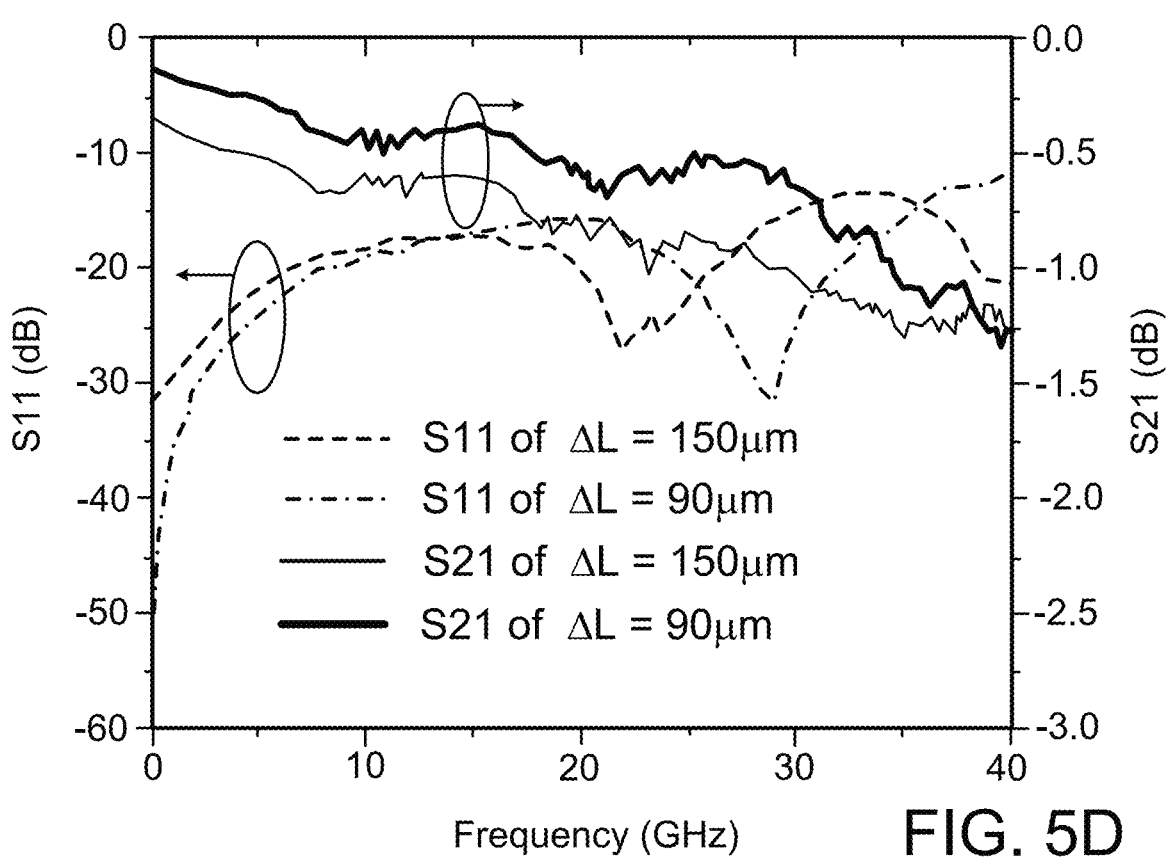

In FIG. 5D, a via length comparison is shown. Specifically, insertion loss is shown as a function of frequency for vias with differing VLs. Both circuits have VW of 30 µm. The circuits with VL of 150 µm shows higher insertion loss compared to VL of 90 µm. It is believed that this is because the longer VL introduces a longer signal path which can result in higher insertion loss.

Figure 5E:
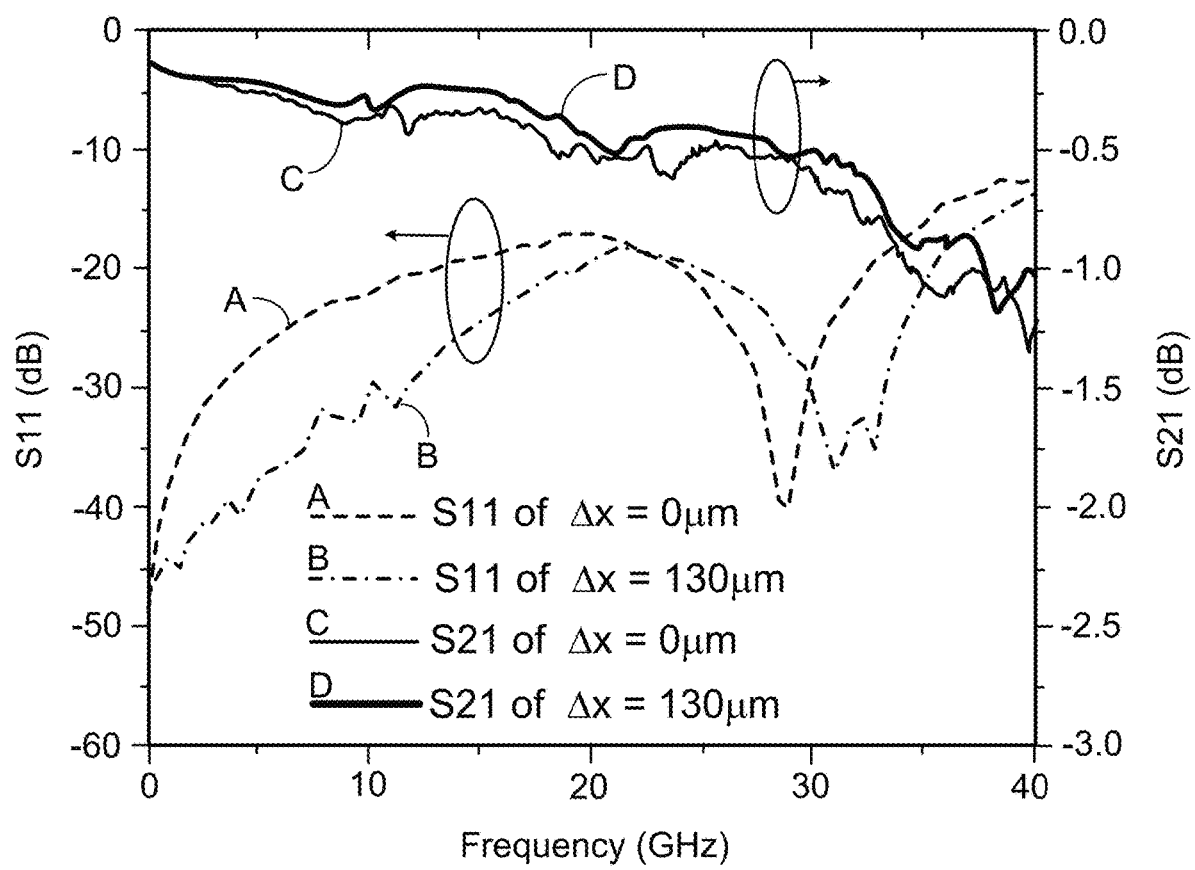

FIG. 5E shows a comparison of via offset, Δx, relative to the midpoint in the ground plane width. In particular, insertion loss is plotted as a function of frequency for vias with a Δx of 0 µm (traces A and C) and for vias with a Δx of 130 µm (traces B and D). Both circuits possess the same via size dimensions. From the measurement results, higher Δx shows better S21 data. Therefore, it is believed that placing via position on G closer to S can provide better via performance.

In order to find the loss of Via-AAO-CPW section, influences from other CPW lines in the test circuits should be removed. The five-unit CPW 401 with vias includes two feed line (L2), four CPW sections (L3) and five Via-AAO-CPW sections. The loss of L2 and L3 sections can be measured and obtained from standard CPW lines. So, the insertion loss of 0.3 mm long Via-AAO-CPW section with type 1 vias can be calculated with the values of 0.043 at 20 GHz, 0.07 at 30 GHz and 0.095 at 40 GHz (in dB) using the following equation.

$$\text{Loss} = -10 \times \log \frac{|S_{21}| \cdot |S_{12}|}{1 - |S_{11}| \cdot |S_{22}|}$$

Next, to find the loss of single G-S-G via, the loss of CPW below AAO section (L1) should be removed from Via-AAO-CPW section. Two methods are available to remove the loss of L1 and approximate each via loss. The first assumes the loss of a 100 µm CPW below the AAO layer is equal to a 100 µm standard CPW without AAO and can be obtained from measurement. Using the equation above, the attenuation loss can be obtained. The loss of a 100 µm standard CPW above Si wafer is 0.011 at 20 GHz, 0.018 at 30 GHz and 0.024 at 40 GHz (in dB). Therefore, each type 1 G-S-G via loss is expected to be 0.016 at 20 GHz, 0.026 at 30 GHz and 0.035 at 40 GHz (in dB).

The second method assumes the loss of the CPW below the AAO layer is represented by simulation results which is 0.024 at 20 GHz, 0.0379 at 30 GHz and 0.04 at 40 GHz (in dB). Then, each type 1 G-S-G via loss is calculated to be 0.0095 at 20 GHz, 0.016 at 30 GHz and 0.0275 at 40 GHz (in dB).

The comparison of type 1 via and other via technologies reported in technical literature is shown in the following table.

| No. | Substrate | Insertion loss of one G-S-G via (dB) | Insertion loss of test line with two G-S-G vias at 40 Hz (dB) | Via Size | Via Thickness (mm) | Line Length (mm) |
|---|---|---|---|---|---|---|
| 1 | Si: 5000 Ω · cm resistivity (CPW) & AAO (via) | ~0.0275 at 40 GHz | 0.095 (Via-AAO-CPW section) | S: VL × VW = 90 µm × 80 µm G: VL × VW = 90 µm × 390 µm | 1.2 | 0.300 |
| 2 | Si: 5000 Ω · cm resistivity | 0.53 at 75 GHz | 0.93 | Via diameter = 42 µm | 252 | 3.15 |
| 3 | Si: High resistivity | 0.03 at 40 GHz | ~0.3 | Via diameter = 200 µm | 100 | 2.7 |
| 4 | AAO | 0.035 at 40 GHz | ~0.21 | 20 × 30 µm² | 50 | 0.200 |

No. 1 refers to the via technology reported here. No. 2 was reported by S. J. Bleiker, A. C. Fischer, U. Shah, N. Somjit, T. Haraldsson, N. Roxhed, J. Oberhammer, G. Stemme, and F. Niklaus, in in "High Aspect-ratio through silicon vias for high-frequency application fabricated by magnetic assembly of gold-coated nickel wires," *IEEE Trans. Compon., Packag. Manuf. Technol.,* vol. 5, no. 1, pp. 21-27, January 2015. No. 3 was reported by A. Margomenos and L. P. B. Katehi, in "Fabrication and accelerated hermeticity testing of an on-wafer package for RF MEMS," *IEEE Trans. Microw. Theory Tech.,* vol. 52, no. 6, pp. 1626-1636, 2004. No. 4 was reported by J. M. Pinheiro, M. V Pelegrini, L. Amorese, P. Ferrari, G. P. Rehder, and A. L. C. Serrano, in "Nanowire-based through substrate via for millimeter-wave frequencies," in *IEEE MTT-S Int. Microw. Symp. Dig.,* San Francisco, CA, USA, May 2016, pp. 1-4.

Compared to the other work, the vias disclosed here are extremely thin. Considering the 50 µm via thickness in No. 4 and the circuit has 2 vias, the total signal path length is 0.3 mm which is similar to the via-AAO-CPW structures described above. The lower insertion loss of the total signal line with via at 40 GHz, 0.095 dB, is significantly lower than that reported by J. M. Pinheiro et al.

Of course, the dimensions of the vias, CPWs, and other portions of the structures described in FIGS. 4A-4C that are characterized by the experimental data presented in FIGS. 5A-5E are merely examples and, generally, dimensions for similar structures in other embodiments can be determined (e.g., empirically or by calculation) based on the specific application in mind.

A number of embodiments of the invention have been described. Nevertheless, it will be understood that various modifications may be made without departing from the spirit and scope of the invention. For example, while the foregoing techniques involves forming vias on a Si substrate, the techniques can be applied to forming vias on other substrates, such as on glass (e.g., borosilicate glass) and polymer (e.g., polyimide) substrates. Accordingly, other embodiments are within the scope of the following claims.

What is claimed is:

1. A complementary metal-oxide-semiconductor (CMOS) device, comprising:
    a metal oxide layer comprising anodic aluminum oxide (AAO) and one or more nanowires (NW) of an electrically conducting material each formed within a corresponding pore extending through the AAO from a first side of the layer to a second side of the layer opposite the first side;
    a first electrically conducting layer disposed on the first side of the metal oxide layer, the first electrically conducting layer being a Cu layer;
    a second electrically conducting layer disposed on the second side of the metal oxide layer; and
    an adhesion layer between the Cu layer and the metal oxide layer,
    wherein the one or more nanowires form a via electrically connecting the first electrically conducting layer and the second electrically conducting layer, and
    the AAO has a porosity in a range from 8% to 30%.

2. The CMOS device of claim 1, wherein the metal oxide layer has a thickness of 5 µm or less.

3. The CMOS device of claim 1, wherein the metal oxide layer has a thickness in a range from 1 µm to 2 µm.

4. The CMOS device of claim 1, wherein the electrically conducting material of the NWs is Cu.

5. The CMOS device of claim 1, further comprising a Si layer, the metal oxide layer and first and second electrically conducting layers being disposed on the Si layer.

6. The CMOS device of claim 1, wherein the via comprises a bundle of NWs.

7. The CMOS device of claim 1, wherein the adhesion layer comprises TiW alloy and TiW oxide.

8. The CMOS device of claim 7, further comprising a layer of Ti between the Cu layer and the Si layer.

9. The CMOS device of claim 1, wherein at least the first or second electrically conducting layer comprises a coplanar waveguide (CPW).

10. An integrated circuit comprising the CMOS device of claim 1.

11. A method for forming a semiconductor device, comprising:
    forming a first electrically conducting layer on a substrate;
    forming an adhesion layer comprising an alloy on the first electrically conducting layer;
    forming a layer of aluminum on the adhesion layer;
    anodizing the aluminum to form a metal oxide layer comprising anodic aluminum oxide (AAO), the metal oxide layer comprising a plurality of nanopores extending through the AAO from a first side of the metal oxide layer to the first electrically conducting layer;
    depositing an electrically conducting material in the nanopores to form nanowires (NW) in the nanopores; and
    after depositing the electrically conducting material in the nanopores, forming a second electrically conducting layer on the metal oxide layer,
    wherein the one or more nanowires form a via electrically connecting the first electrically conducting layer and the second electrically conducting layer,
    wherein the semiconductor device is the complementary metal-oxide-semiconductor (CMOS) device of claim 1.

12. The method of claim 11, wherein the via comprises a bundle of NWs.

13. The method of claim 11, wherein the metal oxide layer has a thickness of 5 µm or less.

14. The method of claim 11, wherein the electrically conducting material is Cu.

15. The method of claim 14, wherein the adhesion layer comprises TiW.

16. A communication system, comprising:
    an integrated circuit, comprising:
        a metal oxide layer comprising anodic aluminum oxide (AAO) and one or more nanowires (NW) of an electrically conducting material each formed within a corresponding pore extending through the AAO from a first side of the layer to a second side of the layer opposite the first side;
        a first electrically conducting layer disposed on the first side of the metal oxide layer; and
        a second electrically conducting layer disposed on the second side of the metal oxide layer,
    wherein the one or more nanowires form a via electrically connecting the first electrically conducting layer and the second electrically conducting layer; and
    the communication system is for operation at millimeter or sub-millimeter wavelengths.

17. The communication system of claim 16, wherein the metal oxide layer has a thickness of 5 µm or less.

18. The communication system of claim 16, wherein the metal oxide layer has a thickness in a range from 1 µm to 2 µm.

19. The communication system of claim 16, wherein the electrically conducting material of the NWs is Cu.

20. The communication system of claim 16, further comprising a Si layer, the metal oxide layer and first and second electrically conducting layers being disposed on the Si layer.

21. The communication system of claim 16, wherein the via comprises a bundle of NWs.

22. The communication system of claim 16, wherein the AAO has a porosity in a range from 8% to 30%.

23. The communication system of claim 22, wherein the first electrically conducting layer is a Cu layer.

24. The communication system of claim 23, further comprising an adhesion layer between the Cu layer and the metal oxide layer.

25. The communication system of claim 24, wherein the adhesion layer comprises TiW alloy and TiW oxide.

26. The communication system of claim 25, further comprising a layer of Ti between the Cu layer and the Si layer.

27. The communication system of claim 16, wherein at least the first or second electrically conducting layer comprises a coplanar waveguide (CPW).

* * * * *